United States Patent
Sato

(10) Patent No.: US 9,244,342 B2
(45) Date of Patent: Jan. 26, 2016

(54) IMPRINT APPARATUS AND PATTERN TRANSFER METHOD

(75) Inventor: Hiroshi Sato, Utsunomiya (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 12/963,009

(22) Filed: Dec. 8, 2010

(65) Prior Publication Data

US 2011/0147970 A1    Jun. 23, 2011

(30) Foreign Application Priority Data

Dec. 17, 2009   (JP) .................................. 2009-286964
Nov. 22, 2010   (JP) .................................. 2010-260368

(51) Int. Cl.
| | |
|---|---|
| B29C 59/02 | (2006.01) |
| G03F 7/00 | (2006.01) |
| B82Y 10/00 | (2011.01) |
| B82Y 40/00 | (2011.01) |

(52) U.S. Cl.
CPC ............... *G03F 7/0002* (2013.01); *B82Y 10/00* (2013.01); *B82Y 40/00* (2013.01)

(58) Field of Classification Search
CPC ...... B82Y 10/00; B82Y 40/00; H01L 21/027; G03F 9/00; G03F 9/7003
USPC .......................................... 264/293; 425/385
See application file for complete search history.

(56) References Cited

U.S. PATENT DOCUMENTS

| | | | |
|---|---|---|---|
| 6,285,033 B1* | 9/2001 | Matsumoto | 250/548 |
| 6,972,844 B2 | 12/2005 | Tokita | |
| 7,807,065 B2 | 10/2010 | Tokita et al. | |
| 2002/0044269 A1* | 4/2002 | Yonekawa et al. | 355/53 |
| 2004/0021866 A1* | 2/2004 | Watts et al. | 356/401 |
| 2005/0105093 A1* | 5/2005 | Tokita | 356/401 |
| 2005/0151947 A1* | 7/2005 | Fujimaki | 355/55 |
| 2006/0157444 A1* | 7/2006 | Nakamura et al. | 216/54 |
| 2007/0081134 A1 | 4/2007 | Amano | |
| 2009/0098283 A1* | 4/2009 | Jang et al. | 427/164 |
| 2010/0102470 A1* | 4/2010 | Mokaberi | 264/40.5 |
| 2010/0308485 A1 | 12/2010 | Inanami et al. | |

FOREIGN PATENT DOCUMENTS

| | | | | |
|---|---|---|---|---|
| JP | 08008175 A | * | 1/1996 | ............ H01L 21/027 |
| JP | 09115819 A | | 5/1997 | |
| JP | 2002043209 A | | 2/2002 | |
| JP | 2002334833 A | | 11/2002 | |

(Continued)

OTHER PUBLICATIONS

Japanese Office Action Japanese counterpart application No. JP2010-260368, dated Jun. 13, 2014.

(Continued)

*Primary Examiner* — James Sanders
(74) *Attorney, Agent, or Firm* — Rossi, Kimms & McDowell LLP

(57) ABSTRACT

An imprint apparatus comprises a scope which observes a mark formed in each shot of a substrate and a mark formed on a mold and a controller. The controller performs observation by the scope, detects an amount of displacement of the shot with respect to the mold based on the observation result, and, if the detected displacement amount falls outside an allowable range, executes at least one of remeasuring a baseline amount and reexecuting a global alignment process.

10 Claims, 7 Drawing Sheets

(56) References Cited

FOREIGN PATENT DOCUMENTS

| | | | |
|---|---|---|---|
| JP | 2005108975 A | 4/2005 | |
| JP | 2007-103882 A | 4/2007 | |
| JP | 2007165400 A | 6/2007 | |
| JP | 2007305647 A | 11/2007 | |
| JP | 4185941 B2 | 11/2008 | |
| JP | 2009004521 A | 1/2009 | |
| JP | 2009301035 A | 12/2009 | |
| JP | 2010283207 A | 12/2010 | |
| WO | 03046963 A1 | 6/2003 | |

OTHER PUBLICATIONS

Office Action issued in corresponding Japanese Patent Application No. 2010-260368, dated Jan. 6, 2015.

* cited by examiner

IMPRINT APPARATUS AND PATTERN TRANSFER METHOD

BACKGROUND OF THE INVENTION

1. Field of the Invention

The present invention relates to an imprint apparatus, and a pattern transfer method using the imprint apparatus.

2. Description of the Related Art

Imprint technique makes it possible to transfer nanoscale micropatterns, and is beginning to be put into practical use as one nanolithography technique for the mass-production of magnetic recording media and semiconductor devices. In the imprint technique, a mold having a micropattern is used as an original to form the micropattern on a substrate such as a silicon wafer or glass plate by using an apparatus such as an electron-beam exposure apparatus. The micropattern is formed by coating the substrate with a resin (dispensing a resin on the substrate), and curing the resin while the pattern of the mold is pressed against the substrate with the resin being sandwiched between them. Imprint techniques presently put into practical use are the heat cycle method and photo-curing method. The heat cycle method forms a pattern by increasing the fluidity of a thermoplastic resin by heating the resin to a temperature greater than or equal to the glass-transition temperature, pressing a mold against a substrate with the resin having a high fluidity being sandwiched between them, and releasing the mold from the resin after cooling. The photo-curing method forms a pattern by pressing a mold against a substrate with an ultraviolet-curing resin being sandwiched between them, curing the resin by irradiating it with ultraviolet light in this state, and releasing the mold from the cured resin. In the heat cycle method, the transfer time increases due to temperature control, and the dimensional accuracy decreases due to temperature changes. However, the photo-curing method has no such problems. Presently, therefore, the photo-curing method is advantageous in the mass-production of nanoscale semiconductor devices.

Various imprint apparatuses have been implemented in accordance with resin curing methods and applications. As an apparatus for mass-producing semiconductor devices and the like, an apparatus using step and flash imprint lithography (SFIL) is effective. An imprint apparatus fitted for SFIL is disclosed in Japanese Patent No. 4185941. This imprint apparatus includes a substrate stage, a resin coating mechanism, an imprint head, a light irradiation system, and a mechanism for detecting a positioning mark. To perform measurement for aligning a substrate with a mold, the imprint apparatus as described above adopts a so-called die-by-die method in which marks formed on the substrate and mold are optically simultaneously observed for each shot when pressing the mold against the substrate, and a resin is cured by correcting the displacement amount.

In the die-by-die method, however, the overlay accuracy changes from one shot to another, so the product performance must be confirmed. This makes it necessary to test the product performance for all shots in a post-process. Also, performing alignment for each shot takes a long time, and decreases the productivity. Accordingly, the global alignment method is currently most frequently used. In this method, marks of several typical shots are measured, and statistical processing is performed based on the measurements, thereby molding all shots by using the same index. Since the global alignment method performs molding by using the same index, the quality of all shots of a substrate can be determined by conducting a sampling test on a few shots in a post-process. This increases the productivity. Furthermore, in the global alignment method, a substrate is fed under a mold and pressed based on measurement results. Therefore, it is necessary to stably and accurately detect the relative positions (a so-called baseline amount) of the mold and a detection system for observing the substrate. The accuracy is normally ensured by measuring the baseline amount every predetermined time.

SUMMARY OF THE INVENTION

In an imprint apparatus, however, the position of a mold or substrate may change because a force is applied when pressing or releasing the mold. Since this changes the information or baseline amount acquired by global alignment, the displacement of a shot with respect to a pattern of the mold increases. In the present invention, therefore, if displacement exceeding an allowable range occurs in a shot with respect to a pattern, the displacement is rapidly corrected.

According to one aspect of the present invention, there is provided an imprint apparatus for aligning a shot of a substrate with a pattern of a mold by using a baseline amount and a result of a global alignment process, and curing a resin with which the aligned shot of the substrate is coated, while the resin is in contact with the pattern of the mold, thereby sequentially transferring the pattern onto a plurality of shots of the substrate, the apparatus comprising: a scope which observes a mark formed in each shot of the substrate and a mark formed on the mold; and a controller, wherein the controller performs the observation by the scope, detects an amount of displacement of the shot with respect to the mold based on the observation result, and, if the detected displacement amount falls outside an allowable range, executes at least one of remeasuring the baseline amount and reexecuting the global alignment process.

Further features of the present invention will become apparent from the following description of exemplary embodiments with reference to the attached drawings.

DESCRIPTION OF THE EMBODIMENTS

Embodiments of the present invention will be explained below with reference to the accompanying drawings.

First Embodiment

Figure 1:
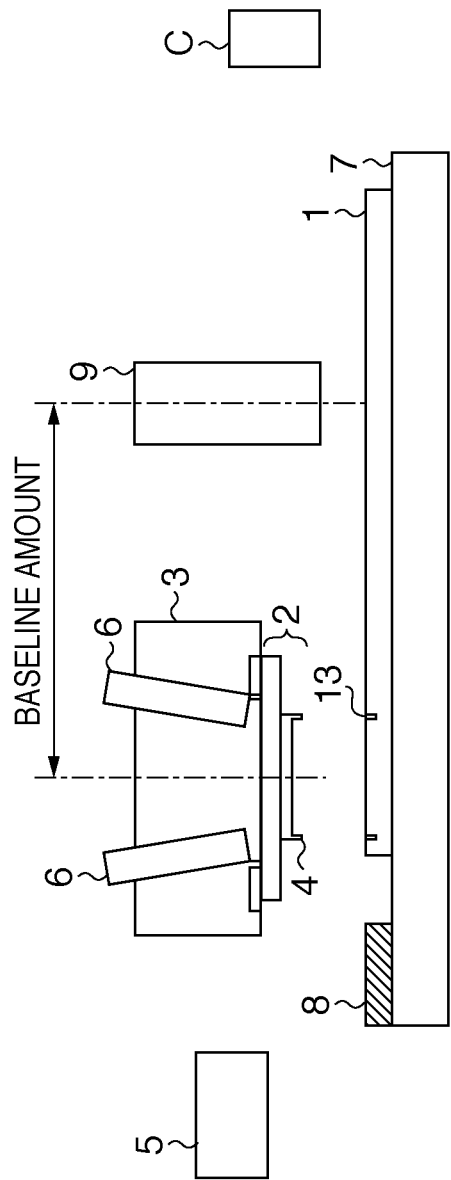
FIG. 1 is a view showing an imprint apparatus.

In an imprint apparatus of the first embodiment as shown in FIG. 1, a support member 3 supports a mold 2 having a pattern. The mold 2 is pressed against a resin with which a substrate 1 is coated, and molding is performed by curing the resin in this state. The support member 3 incorporates a scope 6 for optically observing marks 4 formed on the mold 2 and marks 13 formed in each shot of the substrate 1. Since it is only necessary to be able to measure the relative positional relationship between the marks 4 and 13, the scope 6 can be an image observation scope including an internal imaging optical system for simultaneously observing the two kinds of marks, or a scope that detects an interference signal of the two kinds of marks or a signal obtained by the synergistic effect such as moire of the two kinds of marks. The scope 6 need not be able to simultaneously observe the two marks 4 and 13. For example, the scope 6 may observe the positions of the marks 4 and 13 with respect to a reference position (for example, a mark or sensor surface) formed inside the scope 6, thereby measuring the relative positional relationship between the marks 4 and 13. A stage reference member 8 as a reference for positioning a substrate stage 7 is mounted on it. An off-axis alignment scope (to be referred to as an OA scope hereinafter) 9 is formed outside the pattern center of the mold 2. The closer the OA scope 9 to the center of the pattern surface of the mold 2, the smaller the baseline amount, and the less the error component. The baseline amount is the distance between the optical axis of the OA scope 9 and an axis passing through the center of the pattern surface of the mold 2 and perpendicular to the pattern surface. The position of the axis passing through the center of the pattern surface of the mold 2 and perpendicular to the pattern surface is calculated using the measurement result from the scope 6. A controller C performs a global alignment process of determining the position of each of a plurality of shots of the substrate 1 by processing the results of observation performed by the OA scope 9 on alignment marks 12 formed in these shots. In this embodiment, an alignment mark is the mark 12 different from the mark 13 for detecting the displacement of a shot with respect to a pattern. However, the alignment mark can also be the mark 13. Also, the controller C detects the amount of displacement of a shot with respect to a pattern based on the results of observation performed on the marks 4 and 13 by the scope 6, determines whether the detected displacement amount falls within an allowable range, and executes a measure to correct the displacement if the displacement amount falls outside the allowable range.

Figure 2:
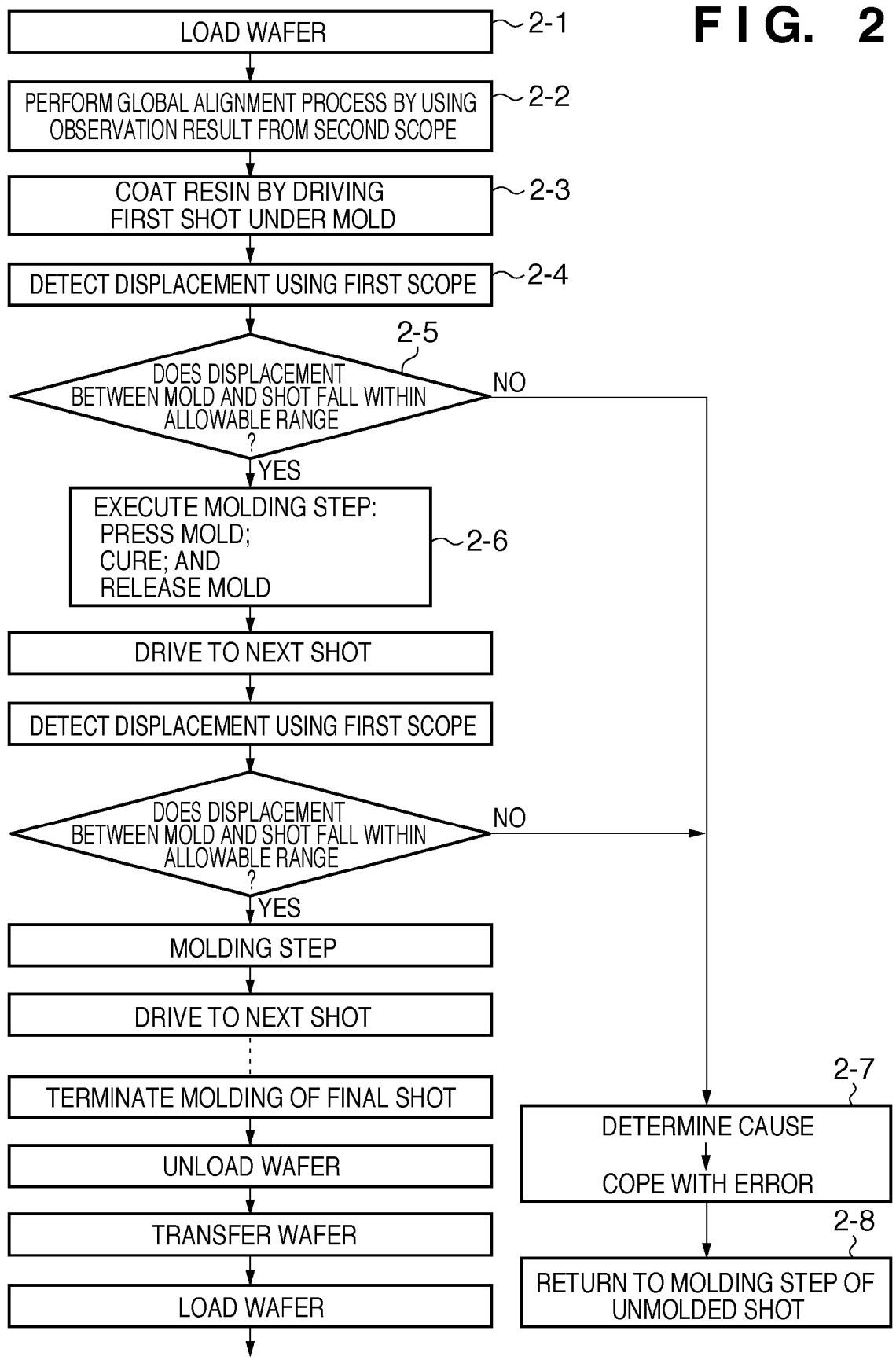
FIG. 2 is a flowchart showing an imprint method.

The method of the first embodiment will be described below with reference to a flowchart shown in FIG. 2. The controller C drives the substrate stage 7 on which the new substrate 1 is mounted, under the off-axis (OA) scope 9 (2-1). The OA scope 9 optically observes the alignment marks 12 formed on the substrate of a few typical shots. The controller C performs a global alignment process by which statistical processing is performed based on the results of the observation performed on the alignment marks 12 by the OA scope 9, thereby determining the position of each shot in accordance with the layout on the substrate 1 (2-2).

Figure 3:
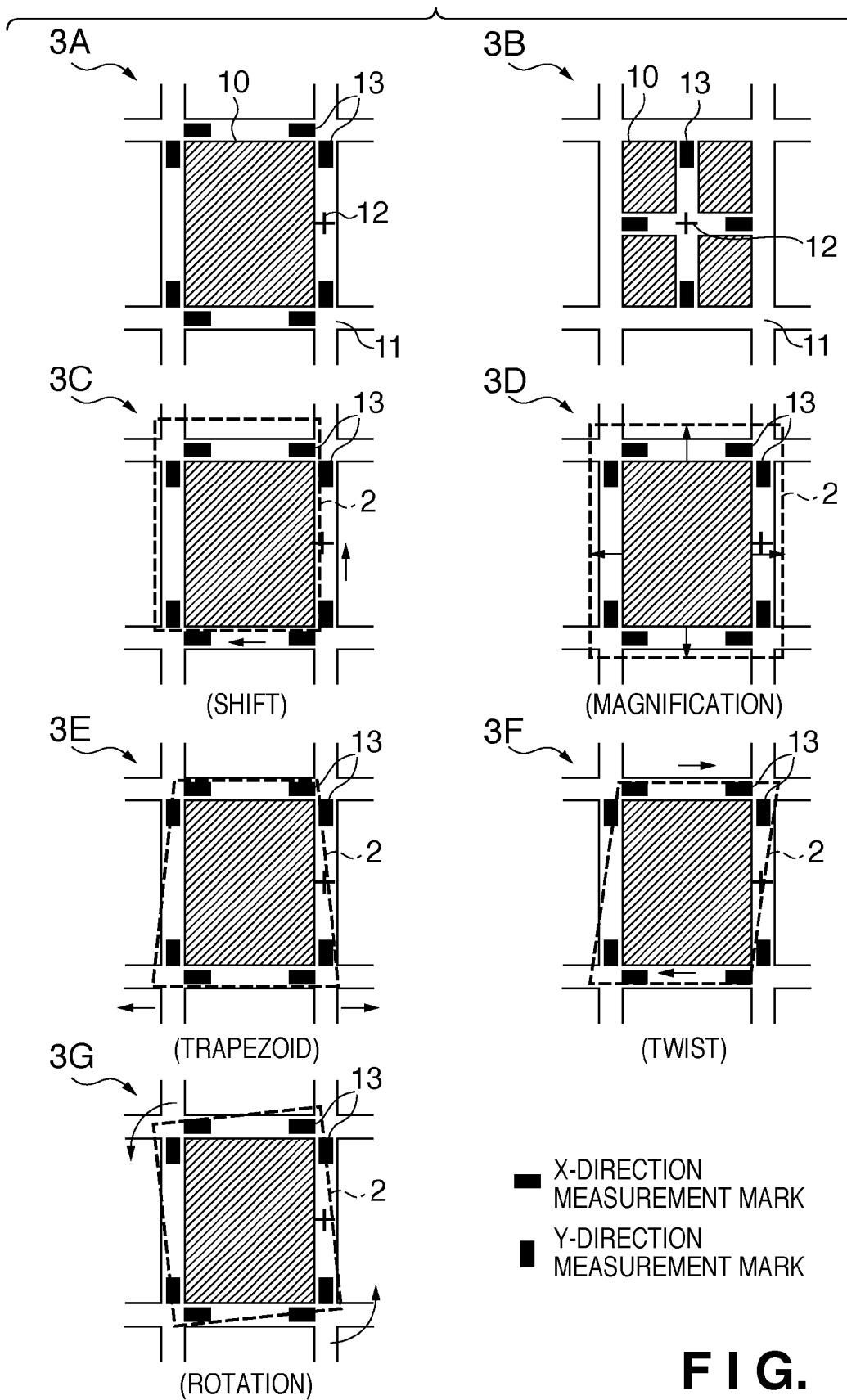
FIG. 3 is a view showing examples of marks formed on a substrate.

Part 3A of FIG. 3 shows an example of marks formed in each shot. Scribe lines 11 are arranged in the periphery of a real element portion 10 of a shot, and the alignment mark 12 for the OA scope 9 and the marks 13 for the scope 6 are formed on the scribe lines 11. Although a two-dimensional mark simultaneously measurable in the X and Y directions is assumed as the mark 12, a mark measurable in only a one-dimensional direction may be used. Also, a mark measurable in only a one-dimensional direction is assumed as the mark 13. However, a two-dimensionally measurable mark may be used, and the number of marks 13 can be reduced in this case. As shown in part 3B of FIG. 3, when a plurality of shots exist in one mold 2, scribe lines are formed between the plurality of shots, so the marks 12 and 13 may be formed on these scribe lines. If the real element portion 10 has a free space, the marks may be formed in the free space, instead of the scribe lines.

The controller C moves the substrate 1 having undergone position correction based on the results of the global alignment process, under the mold 2 based on the baseline amount (2-3). If the resin can maintain the performance for only a short time after coating, the resin coat may be formed when driving the substrate 1 under the mold 2. The mold 2 is pressed against the resin coat formed on the substrate 1 moved under the mold 2, and the resin is molded as it is cured (2-6). Before that, the scope 6 optically observes the marks 4 on the mold 2 and the marks 13 on the substrate, and the controller C detects the amount of displacement of the shot with respect to a pattern based on the observation results (2-4). This displacement detection can be performed simultaneously with or immediately before the pressing of the mold.

When performing the displacement detection simultaneously with the mold pressing, the displacement detection does not decrease the productivity. If an undesirable detection result is obtained, however, it is difficult to recover a shot having undergone the pressing operation, so a correcting operation is necessary before the imprint operation is performed for the next shot.

When a sufficient time has elapsed after pressing, the resin is filled in the mold 2. To transmit exposure light for curing, the mold 2 is often made of a transmitting material such as quartz. Therefore, the marks on the mold 2 cannot be detected if the refractive indices of the resin and mold 2 are close. This can be avoided by depositing a material having a different refractive index on the marks 4 of the mold 2, or forming the marks with a material that shields the detection light. Alternatively, the marks can be detected by rapidly measuring them immediately after pressing with no resin being filled in the mold 2.

When detecting the displacement immediately before pressing the mold, a shot from which an unwanted measurement result is obtained can be remedied by performing the correcting operation. Whether to perform the pressing operation and displacement detecting operation in parallel can be determined from the substrate process step or the like. A simple displacement such as shift between a shot and pattern can be detected by measuring at least one portion in each of the X and Y directions.

Based on the observation results from the scope 6, the controller C determines whether the amount of the displacement between the shot and pattern falls within a preset allowable range (2-5). If the controller C determines that the displacement amount falls within the allowable range, the process advances to a molding step (2-6). If the pressing operation is performed simultaneously with the displacement amount detection using the scope 6 in step 2-4 and the controller C determines that the displacement amount falls within the allowable range, the controller C drives the substrate stage 7 to perform the imprint operation for the next shot.

If the controller C determines in step 2-5 that the displacement amount falls outside the allowable range, the controller C estimates the cause of the displacement from the detection results, and performs a measure to cope with an error in accordance with the cause (2-7). The displacement amount falls outside the allowable range presumably because, for example, the position or shape of the mold 2 has changed, the position or shape of the substrate 1 has changed, or the internal stability of the apparatus has changed. If the displacement amount detected for any of the second and subsequent shots falls outside the allowable range, the controller C estimates the cause of the displacement amount falling outside the allowable range from the detection results, and performs a measure to cope with an error in accordance with the cause.

Parts 3C to 3G of FIG. 3 illustrate examples of the displacement between a shot and pattern. It is possible to estimate which of, for example, shift, magnification, and rotation is the cause of each displacement by observing the marks 4 and detecting the relative displacement amounts of the marks 4 with respect to the marks 13. Examples of the estimation are as follows. Shift shown in part 3C of FIG. 3 can be determined by detecting, at the individual observation points, that the marks 4 have shifted from the marks 13 in one direction. Magnification displacement shown in part 3D of FIG. 3 can be determined by detecting, at the individual observation points, that the marks 4 have uniformly shifted outward from or toward the center of the real element portion. Trapezoidal deformation shown in part 3E of FIG. 3 is determined by detecting that the marks 4 have shifted outward or inward in part 3D of FIG. 3 in different directions in the upper and lower portions or on the right and left sides of the real element, or detecting that the marks 4 have shifted in the same direction but by different displacement amounts in the upper and lower portions or on the right and left sides of the real element. Twist-displacement shown in part 3F of FIG. 3 is determined by detecting that the marks 4 shown in part 3C of FIG. 3 have shifted in different directions in the upper and lower portions or on the right and left sides of the real element. Rotation shown in part 3G of FIG. 3 is determined by detecting that the marks 4 shown in part 3F of FIG. 3 have shifted in different directions in the upper and lower portions and on the right and left sides of the real element, thereby drawing a circle having a given point in the real element as the center. The above-described displacements are examples of the determination, and the embodiment is not limited to these examples.

If shift is detected as shown in part 3C of FIG. 3, for example, a possible cause is that the mold 2 has shifted from the support member 3, the baseline amount has changed, the substrate 1 has shifted from the substrate stage 7, or the like. Therefore, correction can be performed as a measure to cope with an error by adding the shift amount as an offset to the result of the global alignment process. The result detected in step 2-4 can also be used as the offset. As the measure to cope with an error, it is also possible to remeasure the baseline amount or reexecute the global alignment process.

Figure 4:
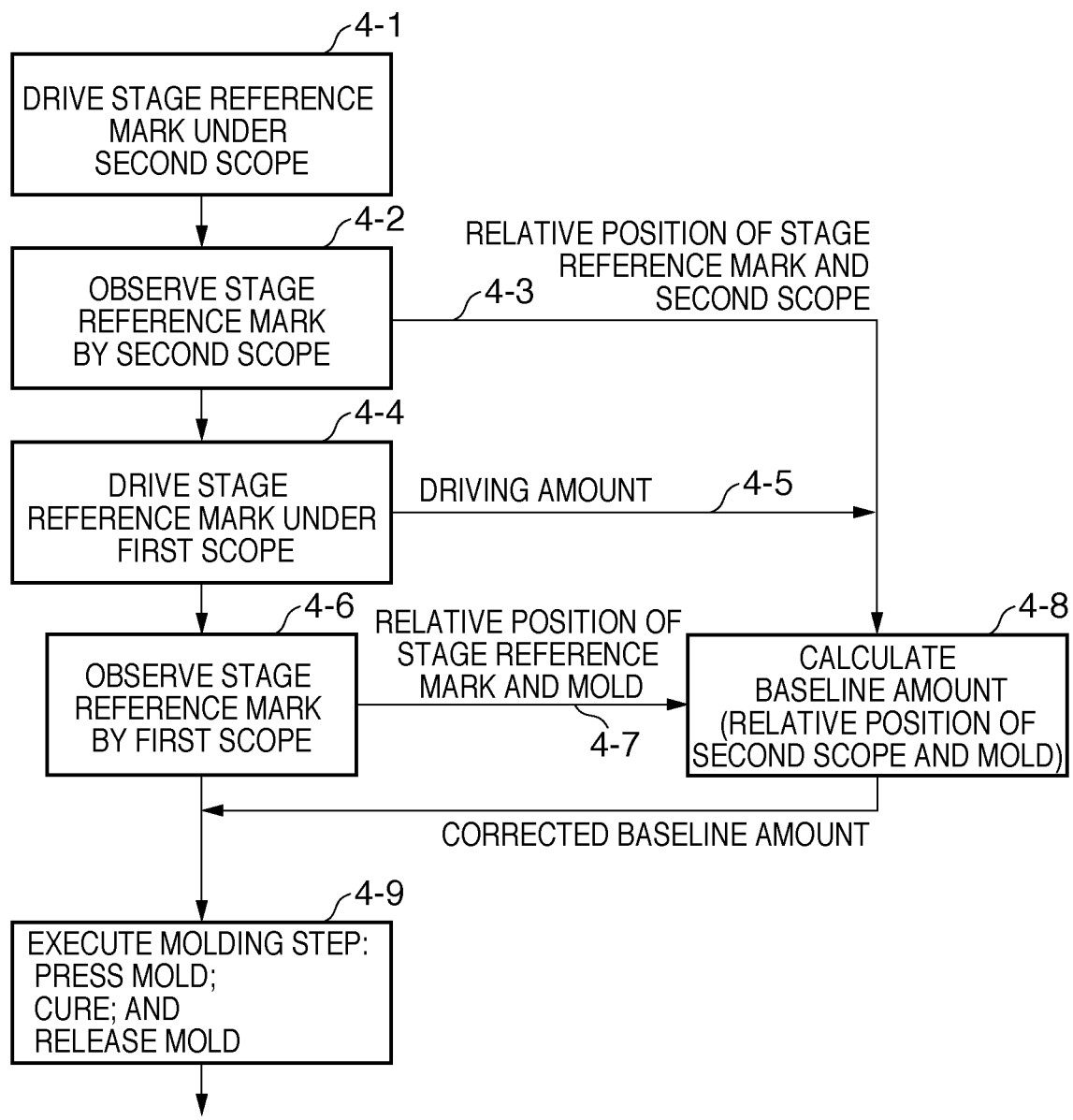
FIG. 4 is a flowchart showing an example of the measurement of a baseline amount.
Figure 5:
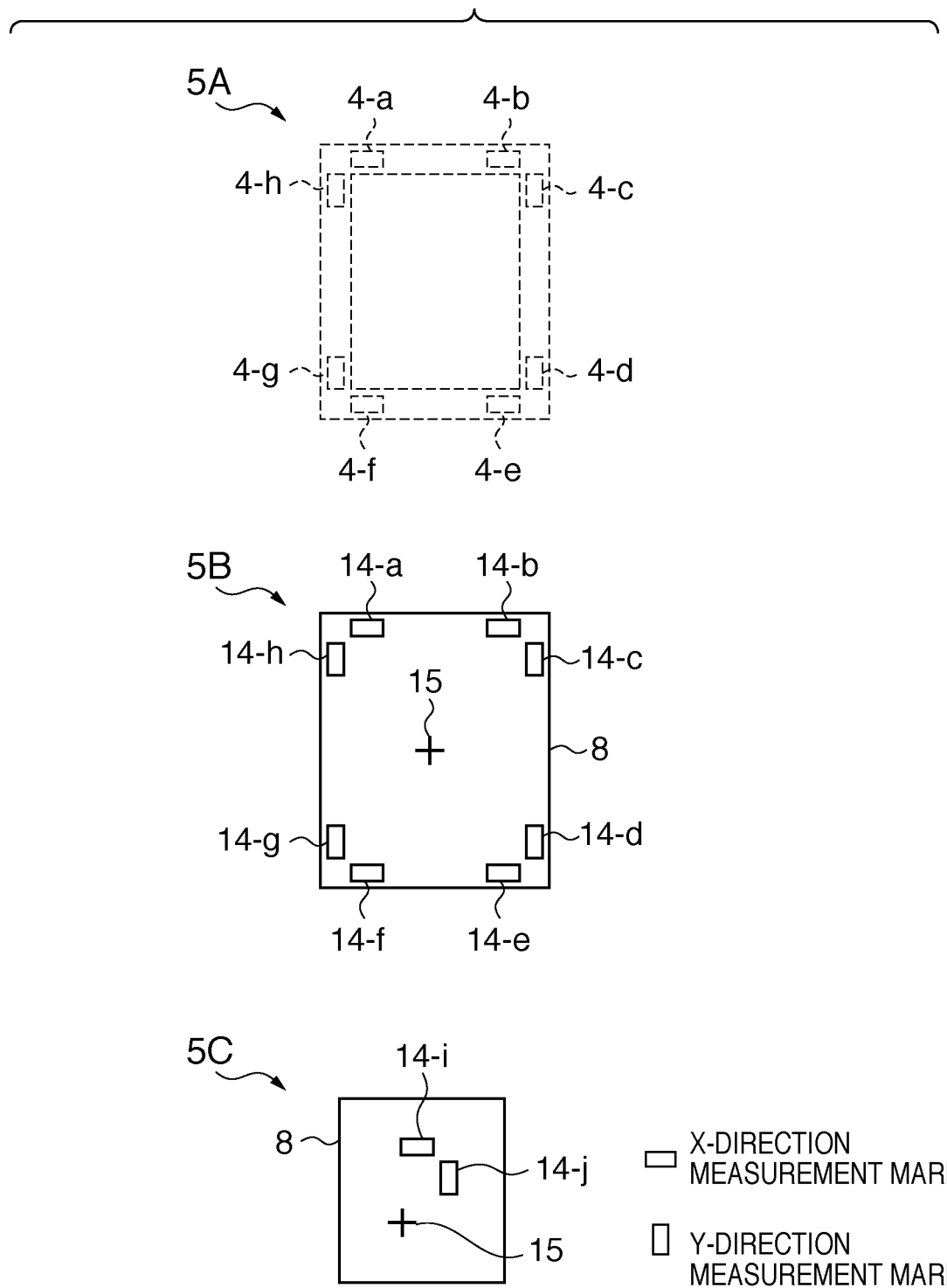
FIG. 5 is a view showing examples of marks formed on a mold and stage reference member.

A method of remeasuring the baseline amount as the measure to cope with an error will be described below. An example of the measurement of the baseline amount in the imprint apparatus will be explained below with reference to a flowchart shown in FIG. 4. On the stage reference member 8, marks 14 and a mark 15 (a third mark) are formed as shown in part 5B of FIG. 5 in order to measure the distance between the optical axis of the OA scope 9 and that of the scope 6. The marks 14 are marks for the scope 6, and formed in positions corresponding to the marks 4 formed on the mold 2 shown in part 5A of FIG. 5. The mark 15 is a mark for the OA scope 9. The controller C drives the stage reference member 8 under the OA scope 9 (4-1). The OA scope 9 observes the mark 15 formed on the stage reference member 8, and measures the relative position of the mark 15 with respect to an internal reference mark (not shown) of the OA scope 9, thereby calculating the relative positions of the mark 15 and OA scope 9 (4-2). Alternatively, the relative positions of the OA scope 9 and stage reference member 8 may be measured based on the sensor of the OA scope 9. The OA scope 9 transmits information of the relative positions of the OA scope 9 and stage reference member 8 to the controller C (4-3). Then, the controller C drives the substrate stage 7 so that the marks 14 of the stage reference member 8 are positioned below the scope 6 (4-4). An interferometer, encoder, or the like precisely measures the moving distance of the marks 14, that is, the driving amount of the substrate stage 7, and transmits the measured driving amount to the controller C (4-5). The scope 6 measures the relative positions of the marks 4 of the mold 2 and the marks 14 of the reference member 8 by simultaneously or separately observing these marks (4-6), and transmits information of the measured relative positions to the controller C (4-7). Note that the positional relationship between the marks 14 and mark 15 can be assured by the drawing accuracy, and by measuring the relationship beforehand. The relative positional relationship (baseline amount) between the scope 6 and OA scope 9 is calculated by these operations (4-8). The baseline amount is corrected based on the calculation result, and the process advances to a molding step (4-9). Accordingly, mold pressing can be performed without any displacement by performing the global alignment process based on the scope 6, and feeding the substrate by the baseline amount.

Figure 6:
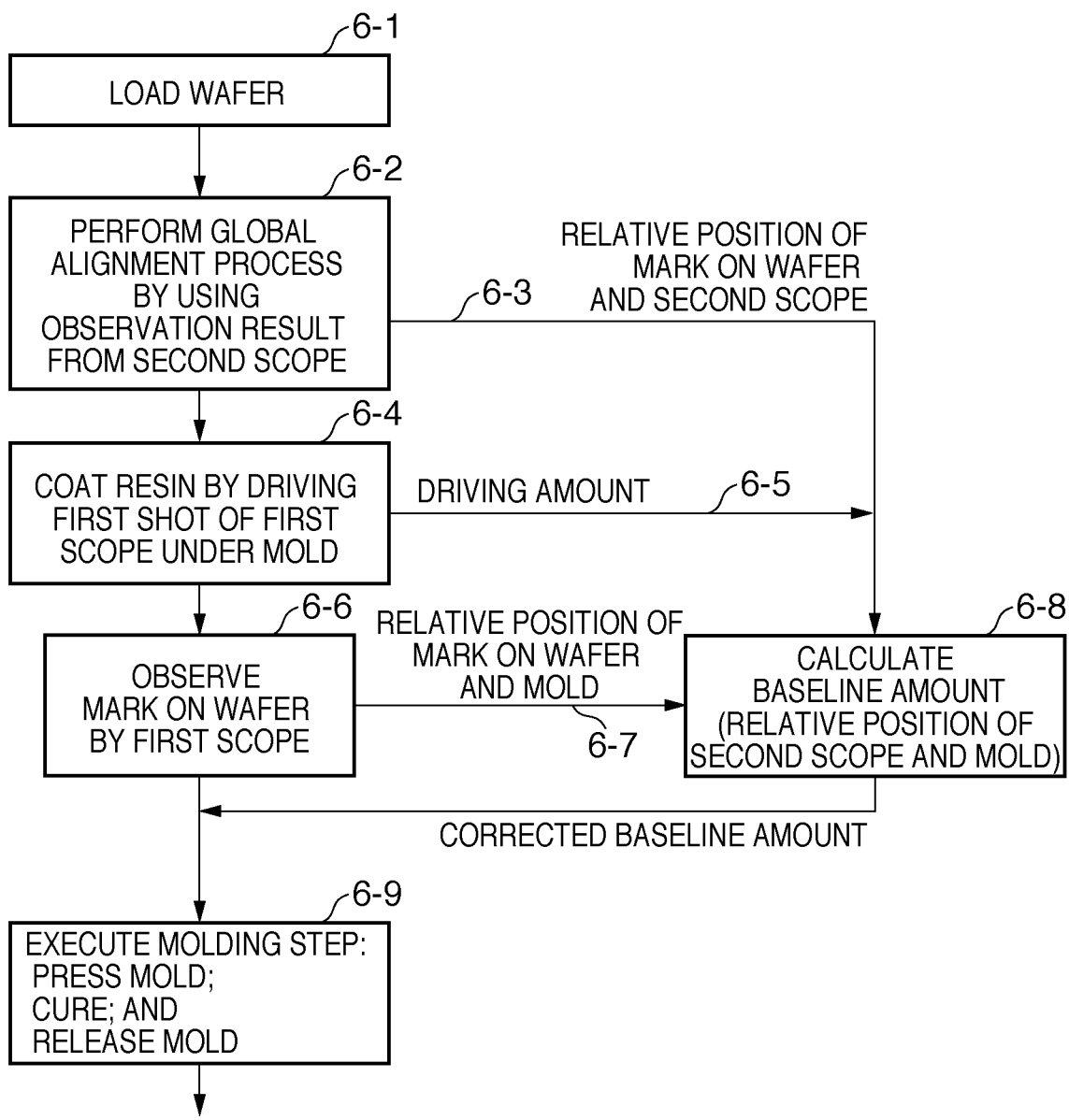
FIG. 6 is a flowchart showing another example of the measurement of the baseline amount.

Another baseline measurement method will be explained below with reference to FIG. 6. The controller C drives the substrate stage 7 on which the new substrate 1 is mounted, under the OA scope 9 (6-1). The OA scope 9 optically observes the alignment marks 12 for the OA scope 9, which are formed on the substrate of a few typical shots. The controller C performs the global alignment process by using the observation results from the OA scope 9, thereby performing position correction corresponding to the layout on the substrate 1 (6-2). At the same time, the OA scope 9 calculates the relative positions of the alignment mark 12 and OA scope 9 by measuring the relative position with respect to the internal reference mark (not shown) of the OA scope 9, and transmits the relative position information to the controller C (6-3). The substrate 1 having undergone the position correction by the global alignment process is fed to position a first shot below the mold 2, while an interferometer, encoder, or the like is precisely measuring the position of the substrate 1 based on the baseline amount (6-4). The interferometer, encoder, or the like transmits the driving amount of the substrate stage 7 to the controller C (6-5). The scope 6 optically observes the marks 4 of the mold 2 and the marks 13 on the substrate 1 fed under the mold 2 (6-6). The scope 6 calculates the relative positions of the marks 13 and scope 6, and transmits the relative position information to the controller C (6-7). Based on these pieces of information, the controller C calculates the baseline amount, and corrects the baseline amount (6-8). This makes it possible to calculate the relative positions of the OA scope 9 and scope 6, that is, the baseline amount. Correction is normally performed separately from the pressing operation, and hence is generally performed every predetermined time from the viewpoint of the productivity. However, this method can perform correction within a short time period by determining the baseline amount for the first shot of each substrate as in this sequence. A shot to be selected in the calculation of the baseline can be a measurement shot actually selected by the global alignment process, or an unselected shot. A selected measurement shot can be used when taking account of the offset of each shot. Note that the embodiment is not limited to this sequence, and it is also possible to remeasure the baseline amount for each shot or for every several shots by the same method, and correct the baseline amount.

Figure 7:
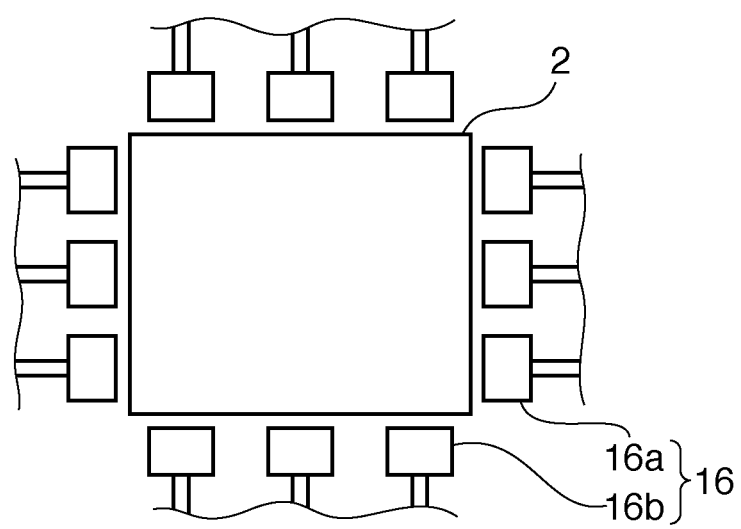
FIG. 7 is a plan view of a mechanism for deforming a mold.

The shape of the mold 2 has probably changed if magnification displacement, trapezoidal deformation, or twist-displacement as shown in part 3D, 3E or 3F of FIG. 3 has occurred. In this case, therefore, the controller C corrects the shape of the mold 2 itself by changing the shape by using a mechanism (mold correction mechanism) that deforms the mold 2 in a direction parallel to the pattern surface, as a measure to cope with an error. FIG. 7 shows an example of a correction mechanism 16. The correction mechanism 16 includes sticking portions 16a that stick to the side surfaces of the mold, and actuators 16b that press the sticking portions 16a against the mold 2 or move the sticking portions 16a away from the mold 2. The controller C acquires the relationship between the driving amount of the actuators 16b and the deformation amount of the mold 2 beforehand, and drives the actuators 16b based on this relationship and a necessary deformation amount corresponding to the measurement result. The controller C can calculate the degree of deformation based on the displacement amount between the marks 4 of the mold 2 and the marks 13 of the substrate 1 detected in step 2-5. Instead, the scope 6 can simultaneously observe the positions of a plurality of marks of the marks 14 formed on the stage reference member 8 and the marks 4 formed on the mold 2, for example, marks 4-a and 14-a, or marks 4-b and 14-b. The arrangement of the marks 14 is already known because there is only a mark manufacturing error, and the marks 14 have a stable shape unlike the marks 13 formed on a shot by the process. Accordingly, all the marks 14 can accurately be observed. However, the mark arrangement changes if the layout changes. As shown in part 5C of FIG. 5, therefore, a small number of marks 14 are formed on the stage reference member 8. The marks 14 and the marks 4 of the mold 2, for example, the mark 4-a and a mark 14-i, the marks 4-b and 14-i, and a mark 4-c and mark 14-j, are observed by driving the substrate stage 7. This makes it possible to detect the relative positions of all the marks 4 and all the marks 14. Consequently, if the controller C detects displacement caused by the shape of the mold 2, for example, magnification displacement, trapezoidal deformation, or twist-displacement, the controller C can correct the displacement by operating the correction mechanism 16.

If rotation has occurred as shown in part 3G of FIG. 3, the mold 2 has probably rotated with respect to the support member 3, or the substrate 1 has probably rotated with respect to the substrate stage 7. In this case, therefore, the controller C rotates the substrate stage 7 so as to correct the detected rotation amount, thereby matching the angles of the substrate 1 and mold 2. However, if, for example, the mold 2 has rotated more than the rotatable amount of the substrate stage 7, it is also possible to allow a mounting mechanism 5 for attaching the mold 2 to the support member 3 and detaching the mold 2 from the support member 3, to detach the mold 2 from the support member 3 once and reattach the mold 2 after that. Alternatively, the controller C can rotate the support member 3 with respect to the substrate stage 7 so that the substrate 1 is relatively rotated with respect to the mold 2.

When the measure to cope with an error as described above is complete, the controller C restarts the pressing operation from an unmolded shot (2-8).

In the above-mentioned embodiment, the controller C performs the global alignment process by using the observation results from the OA scope 9. However, if high detection accuracy is obtained by observing the marks 13 on the substrate 1 and the marks 4 of the mold 2, the controller C can also perform the global alignment process by using the observation results from the scope 6. In this case, it is unnecessary to measure the baseline amount because the scope 6 is the only scope to be used, and this increases the productivity. By detecting the amount of the displacement between the marks 4 and 13 by using the scope 6 described above for each shot or for every several shots, the effectiveness of the result of the global alignment process can be confirmed in real time. Also, defective products can be reduced by immediately performing a measure to cope with an error if the displacement amount falls outside the allowable range.

[Article Manufacturing Method]

A method of manufacturing devices (for example, a semiconductor integrated circuit device and liquid crystal display device) as articles includes a step of forming a pattern on a substrate (wafer, glass plate, or film-like substrate) by using the above-described imprint apparatus. This manufacturing method can further include a step of etching the substrate on which the pattern is formed. Note that when manufacturing another article such as a patterned medium (recording medium) or optical element, the manufacturing method can include another step of processing the substrate on which the pattern is formed, instead of the etching step. The article manufacturing method of this embodiment is superior to the conventional methods in at least one of the performance, quality, productivity, and production cost of the article.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application Nos. 2009-286964, filed Dec. 17, 2009 and 2010-260368, filed Nov. 22, 2010, which are hereby incorporated by reference herein in their entirety.

What is claimed is:

1. An imprint apparatus for aligning a shot of a substrate with a pattern of a mold using a baseline amount and a result of a global alignment process, and curing a resin with which the aligned shot of the substrate is coated, while the resin is in contact with the pattern of the mold, thereby sequentially transferring the pattern onto a plurality of shots of the substrate, the apparatus comprising:

a scope configured to observe a mark formed in each shot of the substrate and a mark formed on the mold; and a controller configured to:

perform observation of marks with said scope;

detect an amount of displacement of the shot with respect to the mold based on the observation result and determine whether the detected displacement amount falls within an allowable range;

when the detected displacement amount falls outside the allowable range, execute at least one of remeasuring the baseline amount or reexecuting the global alignment process, and sequentially transfers the pattern on a plurality of subsequent shots using a result of the remeasuring of the baseline amount or a result of the reexecuted global alignment process, without using the detected displacement amount;

when the detected displacement amount falls within the allowable range, sequentially transfer the pattern on a plurality of subsequent shots using the baseline amount and the result of the global alignment process, without remeasuring the baseline amount and reexecuting the global alignment process; and perform the observation of marks formed in typical shots of the plurality of shots and perform a statistical process based on the results of the observation of marks to calculate an index related to positions of the plurality of shots and determine positions of the plurality of subsequent shots based on the index in reexecuting the global alignment process.

2. The apparatus according to claim 1, wherein:

the controller performs the observation of marks using a second scope different from said scope in reexecuting the global alignment process, and the baseline amount is an amount pertaining to relative positions of said second scope and the mold.

3. The apparatus according to claim 1, wherein the amount of displacement is detected for each shot of the substrate.

4. The apparatus according to claim 1, further comprising:
a mechanism configured to deform the mold,
wherein when the displacement is shift of the shot with respect to the mold, said controller executes at least one of reexecuting the measurement of the baseline amount or reexecuting the global alignment process, and
wherein when the displacement is one of magnification displacement, twist-displacement, or trapezoidal deformation of the shot with respect to the mold, said controller operates said mechanism to correct the one of the detected magnification displacement, twist-displacement, or trapezoidal deformation.

5. The apparatus according to claim 1, further comprising:
a substrate stage configured to hold the substrate;
a support member configured to support the mold; and
a mounting mechanism configured to attach the mold to said support member and detach the mold from said support member,
wherein, when the displacement is shift of the shot with respect to the mold, said controller executes at least one of reexecuting the measurement of the baseline amount or reexecuting the global alignment process, and
wherein, when the displacement is rotation of the shot with respect to the mold, said controller executes one of rotating relative to said substrate stage with respect to the mold to correct the detected rotation amount or causing said mounting mechanism to detach the mold from said support member and reattach the mold to said support member thereafter.

6. An imprint apparatus for aligning a shot of a substrate with a pattern of a mold using a baseline amount and a result of a global alignment process, and curing a resin with which the aligned shot of the substrate is coated, while the resin is in contact with the pattern of the mold, thereby sequentially transferring the pattern onto a plurality of shots of the substrate, the imprint apparatus comprising:
a scope configured to observe a mark formed in each shot of the substrate and a mark formed on the mold; and
a controller configured to:
perform observation of marks with said scope;
detect an amount of displacement of the shot with respect to the mold based on the observation result and determine whether the detected displacement amount falls within an allowable range;
when the detected displacement amount falls outside an allowable range, add the detected displacement amount to a result of the global alignment process, and sequentially transfer the pattern on a plurality of sequential shots using the added result; and
when the detected displacement amount falls within the allowable range, sequentially transfer the pattern on a plurality of subsequent shots without adding the detected displacement amount to the result of the global alignment process.

7. The apparatus according to claim 6, wherein:
the controller performs the observation of marks using a second scope different from said scope in the global alignment process, and
the baseline amount is an amount pertaining to relative positions of said second scope and the mold.

8. The apparatus according to claim 6, wherein the amount of displacement is detected for each shot of the substrate.

9. The apparatus according to claim 8, further comprising:
a mechanism configured to deform the mold,
wherein, when the displacement is shift of the shot with respect to the mold, said controller executes at least one of reexecuting the measurement of the baseline amount or reexecuting the global alignment process, and
wherein, when the displacement is one of magnification displacement, twist-displacement, or trapezoidal deformation of the shot with respect to the mold, said controller operates said mechanism to correct the one of the detected magnification displacement, twist-displacement, or trapezoidal deformation.

10. The apparatus according to claim 8, further comprising:
a substrate stage configured to hold the substrate;
a support member configured to support the mold; and
a mounting mechanism configured to attach the mold to said support member and detach the mold from said support member,
wherein, when the displacement is shift of the shot with respect to the mold, said controller executes at least one of reexecuting the measurement of the baseline amount or reexecuting the global alignment process, and
wherein, when the displacement is rotation of the shot with respect to the mold, said controller executes one of rotating relative to said substrate stage with respect to the mold to correct the detected rotation amount or causing said mounting mechanism to detach the mold from said support member and reattach the mold to said support member thereafter.

* * * * *